(12) United States Patent
Wu et al.

(10) Patent No.: US 10,068,810 B1
(45) Date of Patent: Sep. 4, 2018

(54) MULTIPLE FIN HEIGHTS WITH DIELECTRIC ISOLATION

(71) Applicant: GLOBALFOUNDRIES INC., Grand Cayman (KY)

(72) Inventors: Xusheng Wu, Ballston Lake, NY (US); Yi Qi, Niskayuna, NY (US); Jianwei Peng, Latham, NY (US); Hsien-Ching Lo, Clifton Park, NY (US); Sipeng Gu, Clifton Park, NY (US)

(73) Assignee: GLOBALFOUNDRIES INC., Grand Cayman (KY)

(*) Notice: Subject to any disclaimer, the term of this patent is extended or adjusted under 35 U.S.C. 154(b) by 0 days.

(21) Appl. No.: 15/697,661

(22) Filed: Sep. 7, 2017

(51) Int. Cl.
| | |
|---|---|
| *H01L 21/84* | (2006.01) |
| *H01L 21/762* | (2006.01) |
| *H01L 21/02* | (2006.01) |
| *H01L 27/12* | (2006.01) |
| *H01L 21/8234* | (2006.01) |
| *H01L 21/308* | (2006.01) |

(52) U.S. Cl.
CPC ...... *H01L 21/845* (2013.01); *H01L 21/02532* (2013.01); *H01L 21/3088* (2013.01); *H01L 21/76264* (2013.01); *H01L 21/823418* (2013.01); *H01L 27/1211* (2013.01)

(58) Field of Classification Search
CPC ............. H01L 29/66795; H01L 29/785; H01L 21/823431; H01L 27/0886; H01L 21/823821; H01L 27/0924; H01L 29/41791; H01L 21/845; H01L 21/3086; H01L 21/3088
See application file for complete search history.

(56) References Cited

U.S. PATENT DOCUMENTS

| | | | |
|---|---|---|---|
| 8,334,177 B2 | 12/2012 | Maszara et al. | |
| 9,269,814 B2 | 2/2016 | Hsu | |
| 2014/0191321 A1 | 7/2014 | Cheng et al. | |
| 2015/0056781 A1 | 2/2015 | Akarvardar et al. | |
| 2015/0076561 A1 | 3/2015 | Cheng et al. | |

OTHER PUBLICATIONS

Xiaolong Ma, et al.; "Self Aligned Fin-On-Oxide (FOO) FinFETs for Improved SCE Immunity and Multi-VTH Operation on Si Substrate"; ECS Solid State Letters, 4(4) Q13-Q16 (2015).
C.R. Manoj, et al., "Device Design and Optimization Considerations for Bulk FinFETs"; IEEE Transactions on Electron Devices, vol. 55, No. 2, Feb. 2008.

*Primary Examiner* — Matthew Reames
*Assistant Examiner* — John Bodnar
(74) *Attorney, Agent, or Firm* — Scully Scott Murphy and Presser; Frank DiGiglio

(57) ABSTRACT

A method of forming semiconductor fins having different fin heights and which are dielectrically isolated from an underlying semiconductor substrate. The fins may be formed by etching an active epitaxial layer that is disposed over the substrate. An intervening sacrificial epitaxial layer may be used to template growth of the active epitaxial layer, and is then removed and backfilled with an isolation dielectric layer. The isolation dielectric layer may be disposed between bottom surfaces of the fins and the substrate, and may be deposited, for example, following the etching process used to define the fins. Within different regions of the substrate, dielectrically isolated fins of different heights may have substantially co-planar top surfaces.

10 Claims, 3 Drawing Sheets

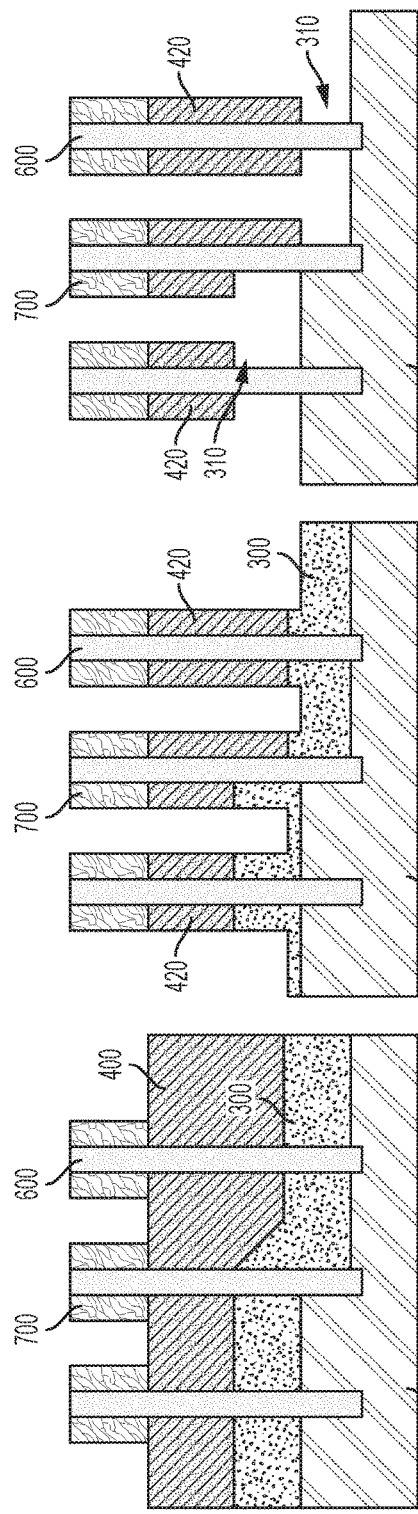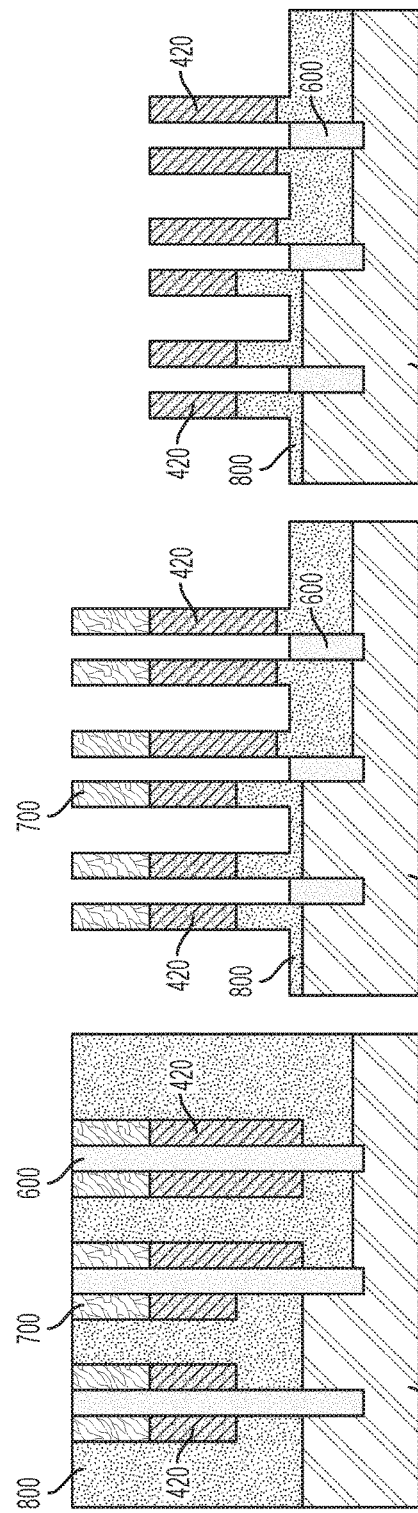

MULTIPLE FIN HEIGHTS WITH DIELECTRIC ISOLATION

BACKGROUND

The present application relates generally to semiconductor device manufacture, and more specifically to the formation of FinFETs having electrically-isolated fins with different fin heights.

Fully-depleted devices such as fin field effect transistors (FinFETs) are candidates to enable scaling of next generation gate lengths to 14 nm and below. Fin field effect transistors (FinFETs) present a three-dimensional architecture where the transistor channel is raised above the surface of a semiconductor substrate, rather than locating the channel at or just below the surface. With a raised channel, the gate can be wrapped around the sides of the channel, which provides improved electrostatic control of the device.

The manufacture of FinFETs typically leverages a self-aligned process to produce extremely thin fins, e.g., 20 nm wide or less, on the surface of a substrate using selective-etching techniques. A gate structure is then deposited to contact multiple surfaces of each fin to form a multi-gate architecture.

The gate structure may be formed using a gate-first or a gate-last fabrication process. A gate-last process, such as a replacement metal gate (RMG) process, utilizes a sacrificial or dummy gate, which is replaced by a functional gate after device activation, i.e., after dopant implantation into source/drain regions of the fins and an associated drive-in anneal, in order to avoid exposing the functional gate materials to the thermal budget associated with activation.

Compared with fins that are contiguous with the substrate, Applicant has observed that dielectrically-isolated FinFETs exhibit superior electrostatic control without requiring extensive sub-fin punch-through stop doping. Such an isolated structure increases device variability and improves leakage characteristics.

Fins having different heights may be used to locally define the channel length of different devices on the same substrate. However, notwithstanding recent developments, it remains a challenge to form isolated semiconductor fins on the same substrate that also have different fin heights.

SUMMARY

In accordance with embodiments of the present application, provided is a manufacturing method to form multiple fins with multiple fin heights and dielectric isolation.

A method of forming such a structure includes depositing a first epitaxial layer on a semiconductor substrate, and depositing a second epitaxial layer on the first epitaxial layer. Openings are formed through the second epitaxial layer and the first epitaxial layer, where the openings extend into the semiconductor substrate. A dielectric layer is then deposited within the openings.

A sidewall spacer layer is formed over upper sidewall surfaces of the dielectric layer and, using the sidewall spacer layer as an etch mask, the second epitaxial layer is etched to form a plurality of semiconductor fins that are disposed over a respective sidewall surface of the dielectric layer. Dielectric isolation of the fins is provided by removing the first epitaxial layer from under the fins and depositing an isolation layer under the fins.

According to further embodiments, a structure includes a first fin disposed over a raised region of a semiconductor substrate, and a second fin having a height greater than the first fin disposed over a recessed region of the semiconductor substrate. An isolation layer is disposed between the semiconductor substrate and each of the first fin and the second fin.

BRIEF DESCRIPTION OF SEVERAL VIEWS OF THE DRAWINGS

The following detailed description of specific embodiments of the present application can be best understood when read in conjunction with the following drawings, where like structure is indicated with like reference numerals and in which:

FIG. 7 shows removal of the capping layer to expose top portions of the dielectric layer followed by the formation of sidewall spacers over exposed dielectric layer sidewalls;

FIG. 8 depicts etching of the active and sacrificial epitaxial layers to form semiconductor fins from the active epitaxial layer having different heights;

FIG. 9 shows the selective removal of the sacrificial epitaxial layer from beneath the fins to form laterally-anchored fins;

FIG. 10 shows deposition and planarization of an isolation oxide between and beneath the fins;

FIG. 11 shows the structure of FIG. 10 following a recess etch of the isolation oxide;

FIG. 12 shows removal of the sidewall spacers to expose top surfaces of semiconductor fins having different heights and separated from the semiconductor substrate by the isolation oxide;

DETAILED DESCRIPTION

Figure 3:
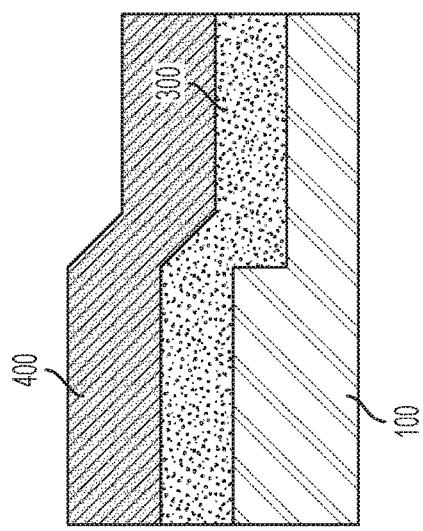
FIG. 3 shows the deposition of a sacrificial epitaxial layer directly over the stepped substrate and the deposition of an active epitaxial layer directly over the sacrificial epitaxial layer.

Reference will now be made in greater detail to various embodiments of the subject matter of the present application, some embodiments of which are illustrated in the accompanying drawings. The same reference numerals will be used throughout the drawings to refer to the same or similar parts.

Described herein is a method of forming plural semiconductor fins having different fin heights, as well as device structures that include such fins. The fins may be formed by etching a semiconductor layer that is disposed over a semiconductor substrate, and may be electrically isolated from the substrate by an isolation dielectric layer. The isolation dielectric layer may be disposed between bottom surfaces of the fins and the substrate, and may be deposited, for example, following the etching process used to define the fins.

According to certain embodiments, the plural fins have respective top surfaces that are substantially co-planar, while the bottom surfaces thereof are disposed at different heights above the underlying semiconductor substrate.

Figure 1:
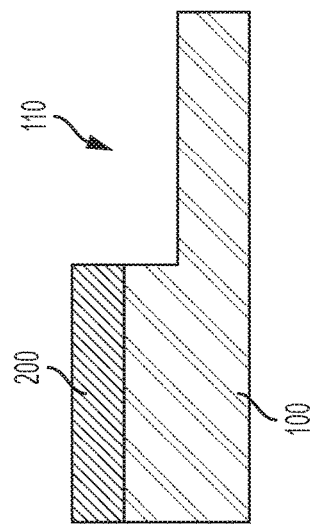
FIG. 1 is a schematic cross-sectional diagram of a FinFET structure at an intermediate stage of fabrication following deposition and patterning of a hard mask over a semiconductor substrate and a recess etch to form a stepped substrate.

Referring to FIG. 1, a schematic cross-sectional diagram of a device structure at an initial stage of fabrication shows the formation of a patterned hard mask 200 over a semiconductor substrate 100, and a recess etch of the semiconductor substrate to form a stepped substrate. In various embodiments, the step height may range from 5 to 20 nm, i.e., 5, 10, 15 or 20 nm, including ranges between any of the foregoing values.

The substrate 100 may include a semiconductor material such as silicon, e.g., single crystal Si or polycrystalline Si, or a silicon-containing material. Silicon-containing materials include, but are not limited to, single crystal silicon germanium (SiGe), polycrystalline silicon germanium, silicon doped with carbon (Si:C), amorphous Si, as well as combinations and multi-layers thereof. As used herein, the term "single crystal" denotes a crystalline solid, in which the crystal lattice of the entire solid is substantially continuous and substantially unbroken to the edges of the solid with substantially no grain boundaries.

The substrate 100 is not limited to silicon-containing materials, however, as the substrate 100 may comprise other semiconductor materials, including Ge and compound semiconductors, including III-V compound semiconductors such as GaAs, InAs, GaN, GaP, InSb, ZnSe, and ZnS, and II-VI compound semiconductors such as CdSe, CdS, CdTe, ZnSe, ZnS and ZnTe.

Substrate 100 may be a bulk substrate or a composite substrate such as a semiconductor-on-insulator (SOI) substrate that comprises, from bottom to top, a handle portion, an isolation layer (e.g., buried oxide layer), and a semiconductor material layer. In the illustrated embodiment, only the topmost semiconductor material layer of such a substrate is shown.

Substrate 100 may have dimensions as typically used in the art and may comprise, for example, a semiconductor wafer. Example wafer diameters include, but are not limited to, 50, 100, 150, 200, 300 and 450 mm. The total substrate thickness may range from 250 microns to 1500 microns, although in particular embodiments the substrate thickness is in the range of 725 to 775 microns, which corresponds to thickness dimensions commonly used in silicon CMOS processing. The semiconductor substrate 100 may comprise (100)-oriented silicon or (111)-oriented silicon, for example.

The stepped substrate may be defined by a patterning process such as photolithography, for example, which includes forming hard mask 200 over the substrate and forming a layer of photoresist material (not shown) atop the hard mask 200. Hard mask layer 200 may include a material such as, for example, silicon nitride or silicon oxynitride, and may be deposited using conventional deposition processes, such as, for example, CVD or plasma-enhanced CVD (PECVD).

The photoresist material may include a positive-tone photoresist composition, a negative-tone photoresist composition, or a hybrid-tone photoresist composition. A layer of photoresist material may be formed by a deposition process such as, for example, spin-on coating.

The deposited photoresist is then subjected to a pattern of irradiation, and the exposed photoresist material is developed utilizing a conventional resist developer. The pattern provided by the patterned photoresist material is thereafter transferred into the hard mask 200 and then into the substrate 100 utilizing at least one pattern transfer etching process.

Figure 2:
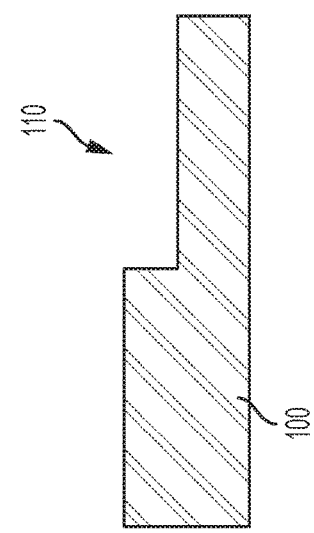
FIG. 2 depicts the stepped substrate following removal of the hard mask.

The pattern transfer etching process is typically an anisotropic etch. In certain embodiments, a dry etching process such as, for example, reactive ion etching (RIE) can be used. In other embodiments, a wet chemical etchant can be used. In still further embodiments, a combination of dry etching and wet etching can be used. As shown in FIG. 2, after etching the semiconductor substrate, the hard mask 200 may be removed to reveal the stepped structure.

Referring to FIG. 3, an epitaxial layer of silicon germanium 300 is formed over the semiconductor substrate 100, and an epitaxial layer of silicon 400 is then formed over the silicon germanium layer 300. In various embodiments, the silicon germanium layer 300 comprises a first epitaxial layer and the silicon layer 400 comprises a second epitaxial layer.

The terms "epitaxy," "epitaxial" and/or "epitaxial growth and/or deposition" refer to the formation of a semiconductor material layer on a deposition surface of a semiconductor material, in which the semiconductor material layer being grown assumes the same crystalline habit as the semiconductor material of the deposition surface. For example, in an epitaxial deposition process, chemical reactants provided by source gases are controlled and the system parameters are set so that depositing atoms alight on the deposition surface and remain sufficiently mobile via surface diffusion to orient themselves according to the crystalline orientation of the atoms of the deposition surface. Therefore, an epitaxial semiconductor material will adopt the same crystalline characteristics as the deposition surface on which it is formed. For example, an epitaxial semiconductor material deposited on a (100) crystal surface will take on a (100) orientation.

In the instant method, the silicon germanium layer 300, which is formed directly over a top surface of the substrate 100, serves as a spacer layer that separates the active epitaxial layer 400 from the substrate 100. As will be appreciated, the silicon germanium layer 300 is a sacrificial layer that serves also to template the epitaxial deposition of the active epitaxial layer 400.

Epitaxial layers (i.e., the sacrificial layer 300 and the semiconductor layer 400) may be formed by a reduced pressure molecular beam epitaxy (MBE) or a chemical vapor deposition (CVD) process, for example, at a substrate temperature of 450-700° C. and a growth pressure (i.e., chamber pressure) of 0.1-700 Torr. A source of silicon may include silane gas ($SiH_4$), and a germanium source for the $SiGe_x$ epitaxy may include germane gas ($GeH_4$). Hydrogen may be used as a carrier gas.

According to various embodiments, the silicon germanium ($SiGe_x$) layer 300 is epitaxially grown on the semiconductor substrate 100. During an exemplary process, a silicon precursor (e.g., silane) flows concurrently into a process chamber with a carrier gas (e.g., $H_2$ and/or $N_2$) and a germanium source (e.g., $GeH_4$). By way of example, the flow rate of the silicon source may be in the range of 5 sccm to 500 sccm, the flow rate of the germanium source may be in the range of 0.1 sccm to 10 sccm, and the flow rate of the carrier gas may be in the range of 1,000 sccm to 60,000 sccm, although lesser and greater flow rates may be used.

As will be appreciated, other suitable gas sources for silicon include silicon tetrachloride ($SiCl_4$), dichlorosilane ($SiH_2Cl_2$), trichlorosilane ($SiHCl_3$), and other hydrogen-reduced chlorosilanes ($SiH_xCl_{4-x}$). In lieu of germane, other germanium sources or precursors may be used to form epitaxial silicon germanium layers. Higher germanes include the compounds with the empirical formula $Ge_xH_{(2x+2)}$, such as digermane ($Ge_2H_6$), trigermane ($Ge_3H_8$) and tetragermane ($Ge_4H_{10}$), as well as others. Organogermanes include compounds with the empirical formula $R_yGe_xH_{(2x+2-y)}$, where R=methyl, ethyl, propyl or butyl, such as methylgermane (($CH_3$)$GeH_3$), dimethylgermane (($CH_3$)$_2GeH_2$), ethylgermane (($CH_3CH_2$)$GeH_3$), methyldigermane (($CH_3$)$Ge_2H_5$), dimethyldigermane (($CH_3$)$_2Ge_2H_4$) and hexamethyldigermane (($CH_3$)$_6Ge_2$). The process chamber may be maintained at a pressure of 0.1 Torr to 700 Torr, while the substrate 100 is maintained at a temperature in the range of 450° C. to 700° C. The process according to certain embodiments is conducted to form an initial SiGe layer with a thickness in a range of 5 to 20 nm. The germanium content of the silicon germanium ($SiGe_x$) layer 300 may be in the range of 25 to 50 atomic percent. According to various embodiments, the silicon germanium layer 300 is compositionally homogeneous.

Following deposition of the silicon germanium layer 300, an epitaxial silicon layer 400 is formed directly over the silicon germanium layer 300. According to an example method, during deposition of the silicon layer 400, a silicon precursor (e.g., silane) is flown concurrently into the process chamber with a carrier gas (e.g., $H_2$ and/or $N_2$). The flow rate of the silane may be in the range of 5 sccm to 500 sccm, and the flow rate of the carrier gas may be in the range of 1,000 sccm to 60,000 sccm, although lesser and greater flow rates may be used.

The process chamber for deposition of the epitaxial silicon layer 400 may be maintained at a pressure of 0.1 Torr to 700 Torr, while the substrate 100 is maintained at a temperature in the range of 450° C. to 700° C. The process according to certain embodiments is conducted to form the silicon layer 400 with a thickness in a range from 30 to 80 nm.

Figure 4:
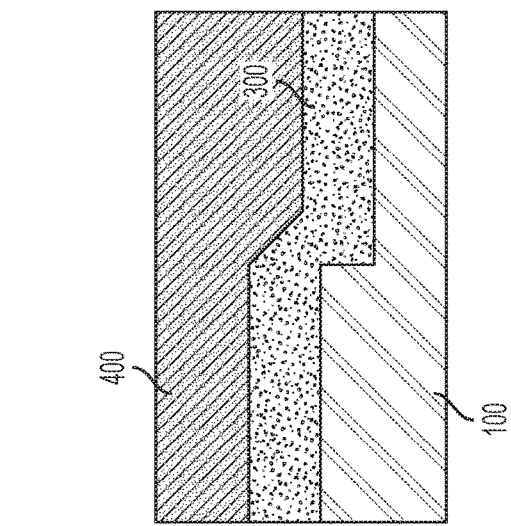
FIG. 4 depicts the structure of FIG. 3 following a planarization step.

Referring to FIG. 4, a CMP process may be used to planarize a top surface of the silicon layer 400. The CMP process may remove a portion of the epitaxial silicon layer 400 over both the raised region of the substrate and the recessed region of the substrate. Chemical mechanical polishing (CMP) is a material removal process that uses both chemical reactions and mechanical forces to remove material and planarize a surface. "Planarization" refers to a material removal process that employs at least mechanical forces, such as frictional media, to produce a substantially two-dimensional surface.

Figure 5:
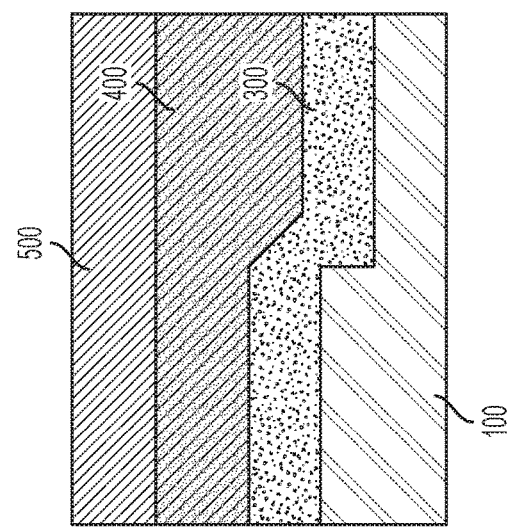
FIG. 5 shows the deposition of a capping layer over the planarized architecture of FIG. 4.

Referring to FIG. 5, a capping layer 500 is deposited over the planarized silicon layer 400. The formation or deposition of capping layer 500 may involve one or more layer formation or deposition techniques such as chemical vapor deposition (CVD), low-pressure chemical vapor deposition (LP-CVD), plasma enhanced chemical vapor deposition (PECVD), metal organic CVD (MOCVD), atomic layer deposition (ALD), and physical vapor deposition (PVD) techniques such as sputtering or evaporation. As will be appreciated, in addition to capping layer 500, one or more of the foregoing techniques may be used to form other layers and structures defined herein.

Capping layer 500 may have a thickness of 10 to 30 nm, and may comprise a material that is etch selective to both silicon and silicon dioxide. Example capping layer materials include silicon nitride and silicon carbide.

Figure 6:
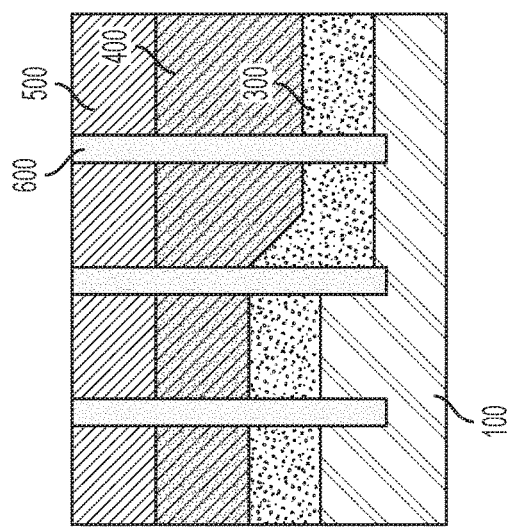
FIG. 6 shows the formation of openings that extend through the capping layer and the epitaxial layers and the deposition of a dielectric layer within the openings.

Referring to FIG. 6, a lithographic process, as described above, is used to form openings that extend through the first and second epitaxial layers and at partially into the stepped semiconductor substrate. In various embodiments, the openings comprise parallel trenches and may each have a width that ranges from 15 to 30 nm. Referring still to FIG. 6, the openings are filled with a dielectric layer 600 using, for example, atomic layer deposition. As will be appreciated, above a top surface of the epitaxial silicon layer 400, the dielectric layer 600 will serve as a mandrel to form a plurality of fins from the epitaxial silicon layer 400 where the width of the dielectric layer 600 represents a fin-to-fin spacing.

Referring to FIG. 7, the capping layer 500 is removed selective to the epitaxial silicon layer 400 and dielectric layer 600 exposing a top portion of the dielectric layer 600. Sidewall spacers 700 are then formed over exposed sidewalls (vertical surfaces) of the dielectric layer 600, i.e., above the epitaxial silicon layer 400. Sidewall spacers 700 may be formed by blanket (conformal) deposition of a spacer material (e.g., using an atomic layer deposition process), followed by a directional (anisotropic) etch such as reactive ion etching (RIE) to remove the spacer material from horizontal surfaces. In certain embodiments, the sidewall spacer thickness is 5 to 20 nm, e.g., 5, 10, 15 or 20 nm, including ranges between any of the foregoing values.

Suitable sidewall spacer materials include oxides, nitrides and oxynitrides, such as silicon dioxide, silicon nitride, silicon oxynitride, and low dielectric constant (low-k) materials such as amorphous carbon, SiOC, SiOCN and SiBCN, as well as a low-k dielectric material. As used herein, a low-k material has a dielectric constant less than that of silicon dioxide.

Exemplary low-k materials include but are not limited to, amorphous carbon, fluorine-doped oxides, or carbon-doped oxides. Commercially-available low-k dielectric products and materials include Dow Corning's SiLK™ and porous SiLK™, Applied Materials' Black Diamond™, Texas Instrument's Coral™ and TSMC's Black Diamond™ and Coral™.

In various embodiments, the sidewall spacers 700 and the dielectric layer 600 are formed from materials that can be etched selectively to one another. In particular embodiments, the dielectric layer 600 comprises silicon dioxide and the sidewall spacers 700 comprise silicon nitride or SiOCN.

As used herein, the compounds silicon dioxide and silicon nitride have compositions that are nominally represented as $SiO_2$, and $Si_3N_4$, respectively. The terms silicon dioxide and silicon nitride, refer to not only these stoichiometric compositions, but also to oxide and nitride compositions that deviate from the stoichiometric compositions.

Referring to FIG. 8, using the sidewall spacers 700 as an etch mask, an anisotropic etch of the silicon epitaxial layer 400 exposes the silicon germanium layer 300 and defines a plurality of fins 420. At this stage of fabrication, prior to removal of the sacrificial layer 300, the fins 420 are supported laterally by the dielectric layer 600 and from below by the silicon germanium layer 300.

Referring to FIG. 9, removal of the sacrificial silicon germanium layer 300 can be achieved by any suitable etching process, such as dry or wet etching. In one example, isotropic dry etching such as ion beam etching, plasma etching or isotropic RIE may be used. In another example, isotropic wet etching may use etching solutions selective to the material subject to removal. Following removal of the silicon germanium layer 300 to form undercut regions 310, semiconductor fins 420 remain laterally supported by dielectric layer 600, which directly contacts the semiconductor substrate 100.

Referring to FIG. 10, an isolation oxide layer 800 is deposited between and beneath the fins, i.e., into the space previously filled by the sacrificial germanium layer 300, and then planarized. The isolation oxide may comprise silicon dioxide, for example. In various embodiments, planarization of the isolation oxide 800 exposes top surfaces of the sidewall spacers 700. Advantageously, removal of the sacrificial layer 300 and deposition of the isolation oxide 800 are independent of the gate length, which allows deposition of the isolation oxide without the formation of voids.

FIG. 11 shows the structure of FIG. 10 following a recess etch of the isolation oxide to reveal fins 420. Etching of the isolation oxide 600 selectively with respect to the fins 420 and sidewall spacers 700 may comprise a directional (anisotropic) etch.

FIG. 12 shows removal of the sidewall spacers to expose top surfaces of semiconductor fins 420 having different heights and separated from the semiconductor substrate 100 by the isolation oxide 800. In the illustrated embodiment, the plural fins have top surfaces that are substantially co-planar. That is, top surfaces of the shorter fins formed over the raised region of the substrate are substantially coplanar with top surfaces of the taller fins formed over the recessed region of the substrate.

Figure 13:
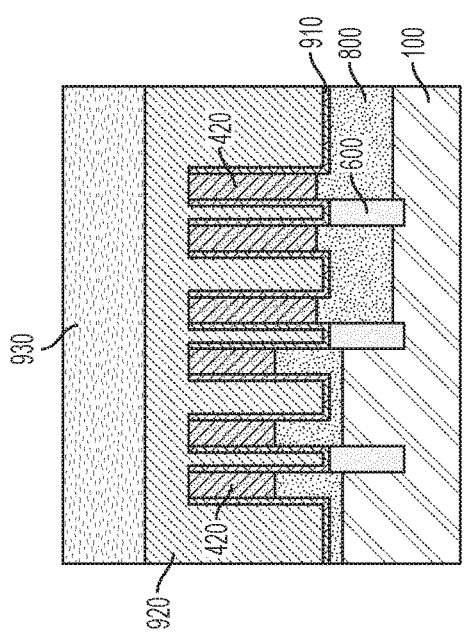
FIG. 13 is a schematic cross-sectional diagram of a FinFET structure at an intermediate stage of fabrication following the formation of gate dielectric and gate conductor layers over isolated fins having different heights.

Referring to FIG. 13, a schematic cross-sectional diagram shows a FinFET structure having isolated fins 420 of different heights following the formation of gate dielectric and gate conductor layers 910, 920. As known to those skilled in the art, referring also to FIGS. 14 and 15, a gate is formed over a channel region 422 of the semiconductor fin 420 between source/drain regions 424, where the gate dielectric 910 is disposed directly over the channel region and a gate conductor 920 is disposed over the gate dielectric.

In various embodiments, the gate includes a conformal gate dielectric 910 formed over the exposed top and sidewall surfaces of the fins, and a gate conductor 920 formed over the gate dielectric.

The gate dielectric 910 may include silicon dioxide, silicon nitride, silicon oxynitride, a high-k dielectric, or other suitable material. As used herein, a high-k material has a dielectric constant greater than that of silicon dioxide. A high-k dielectric may include a binary or ternary compound such as hafnium oxide ($HfO_2$). Further exemplary high-k dielectrics include, but are not limited to, $ZrO_2$, $La_2O_3$, $Al_2O_3$, $TiO_2$, $SrTiO_3$, $BaTiO_3$, $LaAlO_3$, $Y_2O_3$, $HfO_xN_y$, $HfSiO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, $SiO_xN_y$, $SiN_x$, a silicate thereof, and an alloy thereof. Each value of x may independently vary from 0.5 to 3, and each value of y may independently vary from 0 to 2. The gate dielectric thickness may range from 1 nm to 10 nm, e.g., 1, 2, 4, 6, 8 or 10 nm, including ranges between any of the foregoing.

The gate conductor 920 may include a conductive material such as polysilicon, silicon-germanium, a conductive metal such as Al, W, Cu, Ti, Ta, W, Co, Pt, Ag, Au, Ru, Ir, Rh and Re, alloys of conductive metals, e.g., Al—Cu, silicides of a conductive metal, e.g., W silicide, and Pt silicide, or other conductive metal compounds such as TiN, TiC, TiSiN, TiTaN, TaN, TaAlN, TaSiN, TaRuN, WSiN, NiSi, CoSi, as well as combinations thereof. The gate conductor may comprise one or more layers of such materials such as, for example, a metal stack including a work function metal layer and/or a conductive liner and a fill metal (not separately shown). In certain embodiments, the gate conductor 920 comprises a titanium nitride (TiN) layer directly over the gate dielectric 910 and a tungsten or cobalt fill layer over the titanium nitride layer. In the illustrated structure, top surfaces of the respective fins 420 are substantially co-planar. Referring still to FIG. 13, a gate cap 930, such as a layer of silicon nitride, may be formed over the gate.

Figure 14:
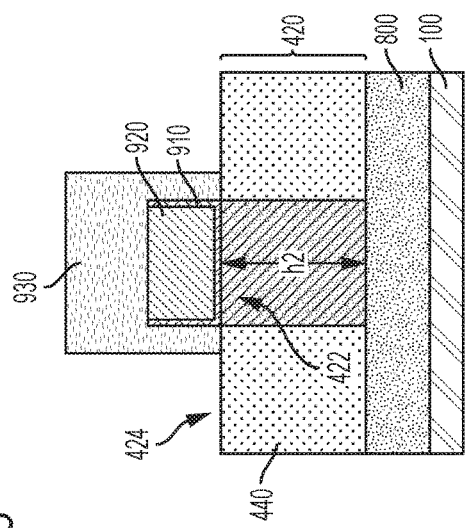
FIG. 14 is a cross-sectional schematic showing a portion of a FinFET device having a shorter fin.
Figure 15:
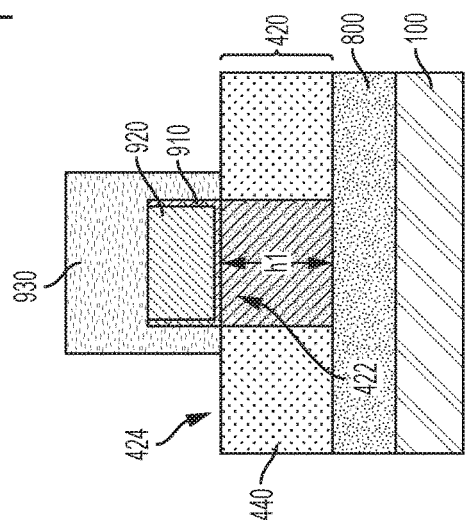
FIG. 15 is a cross-sectional schematic showing a portion of a FinFET device having a longer fin adjacent to the FinFET device having a shorter fin where top surfaces of the shorter and longer fins are substantially co-planar.

FIG. 14 is a cross-sectional schematic showing a portion of a FinFET structure including a fin 420 having a height h1, while FIG. 15 is a cross-sectional schematic showing a portion of a FinFET structure including a taller fin 420 having a height h2 (h2>h1). In exemplary embodiments, shorter fins may have a height h1 that ranges from 30 to 50 nm, e.g., 30, 35, 40, 45 or 50 nm, including ranges between any of the foregoing values, while taller fins may have a height h2 that ranges from 40 to 70 nm, e.g., 40, 45, 50, 55, 60, 65 or 70 nm, including ranges between any of the foregoing values.

Raised source/drain junctions 440 are formed over source/drain regions 424 of the fins 420 laterally adjacent to the channel regions 422. Source/drain junctions 440 may be formed by ion implantation or selective epitaxy prior to formation of the gates, optionally using a sacrificial gate (not shown) as an alignment mask. For instance, source/drain junctions 440 may be formed by selective epitaxy into self-aligned cavities that are defined over the fins between adjacent sacrificial gates.

As will be appreciated, the cross-sectional views in FIGS. 14 and 15 are taken orthogonal to the cross-sectional views of FIGS. 1-13, and while shown separately may represent shorter and taller fins formed on the same semiconductor substrate 100.

As used herein, the singular forms "a," "an" and "the" include plural referents unless the context clearly dictates otherwise. Thus, for example, reference to a "fin" includes examples having two or more such "fins" unless the context clearly indicates otherwise.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that any particular order be inferred. Any recited single or multiple feature or aspect in any one claim can be combined or permuted with any other recited feature or aspect in any other claim or claims.

It will be understood that when an element such as a layer, region or substrate is referred to as being formed on, deposited on, or disposed "on" or "over" another element, it can be directly on the other element or intervening elements may also be present. In contrast, when an element is referred to as being "directly on" or "directly over" another element, no intervening elements are present.

While various features, elements or steps of particular embodiments may be disclosed using the transitional phrase "comprising," it is to be understood that alternative embodiments, including those that may be described using the transitional phrases "consisting" or "consisting essentially of," are implied. Thus, for example, implied alternative embodiments to an isolation oxide that comprises silicon dioxide include embodiments where an isolation oxide consists essentially of silicon dioxide and embodiments where an isolation oxide consists of silicon dioxide.

It will be apparent to those skilled in the art that various modifications and variations can be made to the present invention without departing from the spirit and scope of the invention. Since modifications, combinations, sub-combinations and variations of the disclosed embodiments incorporating the spirit and substance of the invention may occur to persons skilled in the art, the invention should be construed to include everything within the scope of the appended claims and their equivalents.

What is claimed is:

1. A method of forming a structure, comprising:
depositing a first epitaxial layer on a semiconductor substrate;
depositing a second epitaxial layer on the first epitaxial layer;
forming openings through the second epitaxial layer and the first epitaxial layer, wherein the openings extend into the semiconductor substrate;
depositing a dielectric layer within the openings;
forming a sidewall spacer layer over upper sidewall surfaces of the dielectric layer;
etching the second epitaxial layer using the sidewall spacer layer as an etch mask to form semiconductor fins each disposed over a respective sidewall surface of the dielectric layer;
removing the first epitaxial layer from under the fins; and
depositing an isolation layer under the fins.

2. The method of claim 1, wherein the first epitaxial layer comprises silicon germanium and the second epitaxial layer comprises silicon.

3. The method of claim 1, further comprising planarizing the second epitaxial layer prior to forming the openings.

4. The method of claim 1, further comprising forming a capping layer over the second epitaxial layer prior to forming the openings.

5. The method of claim 4, wherein forming the sidewall spacer layer comprises removing the capping layer to expose the upper sidewall surfaces of the dielectric layer.

6. The method of claim 1, wherein the openings comprise parallel trenches.

7. The method of claim 1, wherein the semiconductor substrate includes a raised region and a recessed region adjacent to the raised region, and the fins have a first height over the raised region and a second height greater than the first height over the recessed region.

8. The method of claim 7, wherein top surfaces of the fins over the raised region are substantially coplanar with top surfaces of the fins over the recessed region.

9. The method of claim 1, wherein the first epitaxial layer has a thickness of 5 to 20 nm.

10. The method of claim 1, wherein the dielectric layer comprises silicon dioxide and the sidewall spacer layer comprises silicon nitride.

* * * * *